(12) United States Patent
Yamaguchi

(10) Patent No.: US 7,323,777 B2
(45) Date of Patent: Jan. 29, 2008

(54) SEMICONDUCTOR DEVICE, METHOD OF MANUFACTURING THE SAME, CIRCUIT BOARD, AND ELECTRONIC INSTRUMENT

(75) Inventor: Koji Yamaguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 50 days.

(21) Appl. No.: 11/114,118

(22) Filed: Apr. 26, 2005

(65) Prior Publication Data

US 2005/0194687 A1 Sep. 8, 2005

Related U.S. Application Data

(62) Division of application No. 10/637,615, filed on Aug. 11, 2003, now Pat. No. 6,969,908.

(30) Foreign Application Priority Data

Aug. 21, 2002 (JP) ............... 2002-240777
Aug. 1, 2003 (JP) ............... 2003-284995

(51) Int. Cl.
*H01L 23/48* (2006.01)
(52) U.S. Cl. ................ 257/734; 257/680
(58) Field of Classification Search ........ 257/734–738, 257/415–421, 678–682, E23.001–E23.003, 257/E21.508
See application file for complete search history.

(56) References Cited

U.S. PATENT DOCUMENTS

| 5,046,161 | A | * | 9/1991 | Takada | ............... 257/778 |
|---|---|---|---|---|---|
| 6,111,317 | A | * | 8/2000 | Okada et al. | ............... 257/737 |
| 6,313,532 | B1 | * | 11/2001 | Shimoishizaka et al. | .... 257/734 |
| 6,441,500 | B1 | | 8/2002 | Sumikawa et al. | |
| 6,696,765 | B2 | | 2/2004 | Kazama et al. | |
| 6,825,551 | B1 | * | 11/2004 | Do Bento Vieira | ......... 257/678 |
| 2001/0004133 | A1 | * | 6/2001 | Ihara | ............... 257/750 |
| 2004/0180486 | A1 | * | 9/2004 | Hashimoto | ............... 438/198 |
| 2004/0188838 | A1 | * | 9/2004 | Okada et al. | ............... 257/738 |

FOREIGN PATENT DOCUMENTS

| JP | A-11-204678 | 7/1999 |
|---|---|---|
| JP | A-11-224885 | 8/1999 |
| JP | A-11-307694 | 11/1999 |
| JP | A-2000-353716 | 12/2000 |
| JP | A-2001-085560 | 3/2001 |

OTHER PUBLICATIONS

U.S. Appl. No. 10/637,614, filed Aug. 11, 2003, Yamaguchi.

* cited by examiner

*Primary Examiner*—Nathan W Ha
(74) *Attorney, Agent, or Firm*—Oliff & Berridge, PLC

(57) ABSTRACT

A semiconductor substrate has an integrated circuit, an interconnect electrically connected to the inside of the semiconductor substrate, and an electrode formed on the interconnect. A plurality of resin layers are separately formed on the semiconductor substrate so that part of the semiconductor substrate is exposed. A redistribution interconnect is electrically connected to the electrode. An external terminal is formed on the redistribution interconnect and supported by the resin layers.

10 Claims, 8 Drawing Sheets

SEMICONDUCTOR DEVICE, METHOD OF MANUFACTURING THE SAME, CIRCUIT BOARD, AND ELECTRONIC INSTRUMENT

Japanese Patent Application No. 2002-240777 filed on Aug. 21, 2002, and Japanese Patent Application No. 2003-284995 filed on Aug. 1, 2003, are hereby incorporated by reference in their entirety.

BACKGROUND

The present invention relates to a semiconductor device, a method of manufacturing the same, a circuit board, and an electronic instrument.

FIG. 15 is a plan view schematically showing a configuration of a conventional chip size package. FIG. 16 is a cross-sectional view of the chip size package shown in FIG. 15 taken along the line XVI-XVI. An interconnect layer 122 connected with an active region is formed on a semiconductor device 121, and pads 123 are formed on the interconnect layer 122. A stress relief layer 124 is formed on the active region of the semiconductor device 121 so that the pads 123 are exposed. A redistribution interconnect 125 is formed from the top of the pad 123 so as to extend onto the stress relief layer 124. A solder resist film 126 is formed on the wiring pattern 125. An opening 127 which exposes a part of the wiring pattern 125 on the stress relief layer 124 is formed in the solder resist film 126. A solder ball 128 is formed on the wiring pattern 125 through the opening 127. The stress relief layer 124 and the solder resist film 126 are formed of a resin.

Therefore, since the resin layer is formed over a wide area of the semiconductor device 121, it is difficult to prevent warping of the semiconductor device 121 which occurs due to internal stress of the resin layer.

SUMMARY

According to a first aspect of the present invention, there is provided a semiconductor device comprising:

a semiconductor substrate having an integrated circuit, an interconnect electrically connected to the inside of the semiconductor substrate, and an electrode formed on the interconnect;

a plurality of resin layers separately formed on the semiconductor substrate so that part of the semiconductor substrate is exposed;

a wiring pattern electrically connected to the electrode; and an external terminal formed on the wiring pattern and supported by the resin layers.

According to a second aspect of the present invention, there is provided a semiconductor device comprising:

a semiconductor substrate having an integrated circuit formed in the semiconductor substrate, an interconnect electrically connected to the inside of the semiconductor substrate, and an electrode formed on the interconnect;

a resin layer formed on the semiconductor substrate and having a penetrating hole so that part of the semiconductor substrate is exposed;

a wiring pattern electrically connected to the electrode; and an external terminal formed on the wiring pattern and supported by the resin layer.

According to a third aspect of the present invention, there is provided a semiconductor device comprising:

an interposer substrate on which a semiconductor chip is surface-mounted;

an interconnect layer formed on a back surface of the interposer substrate;

protective layers separately disposed on the interconnect layer;

a solder ball connected to the interconnect layer through the protective layer; and a through-hole formed in the interposer substrate and connecting the semiconductor chip with the interconnect layer.

According to a fourth aspect of the present invention, there is provided a circuit board on which is mounted the above-described semiconductor device.

According to a fifth aspect of the present invention, there is provided an electronic instrument comprising the above-described semiconductor device.

According to a sixth aspect of the present invention, there is provided a method of manufacturing a semiconductor device comprising:

forming a plurality of resin layers separated from each other on a semiconductor substrate so that part of the semiconductor substrate is exposed, the semiconductor substrate having an integrated circuit, an interconnect electrically connected to the inside of the semiconductor substrate, and an electrode formed on the interconnect;

forming a wiring pattern electrically connected to the electrode; and forming an external terminal on the wiring pattern to be supported by the resin layers.

According to a seventh aspect of the present invention, there is provided a method of manufacturing a semiconductor device comprising:

forming a resin layer on a semiconductor substrate which has an integrated circuit, an interconnect electrically connected to the inside of the semiconductor substrate, and an electrode formed on the interconnect, the resin layer including a penetrating hole which exposes part of the semiconductor substrate;

forming a wiring pattern electrically connected to the electrode; and forming an external terminal on the wiring pattern to be supported by the resin layer.

According to an eighth aspect of the present invention, there is provided a method of manufacturing a semiconductor device comprising:

forming an interconnect layer on both surfaces of an interposer substrate, the interconnect layers being connected to each other by a through-hole;

forming a protective layer on one of the interconnect layers provided on a back surface of the interposer substrate;

dividing the protective layer by patterning to form an opening which exposes part of the one of the interconnect layers;

forming a solder ball connected to the one of the interconnect layers through the opening; and mounting a semiconductor chip on the interposer substrate.

DETAILED DESCRIPTION OF EMBODIMENTS

Figure 1:
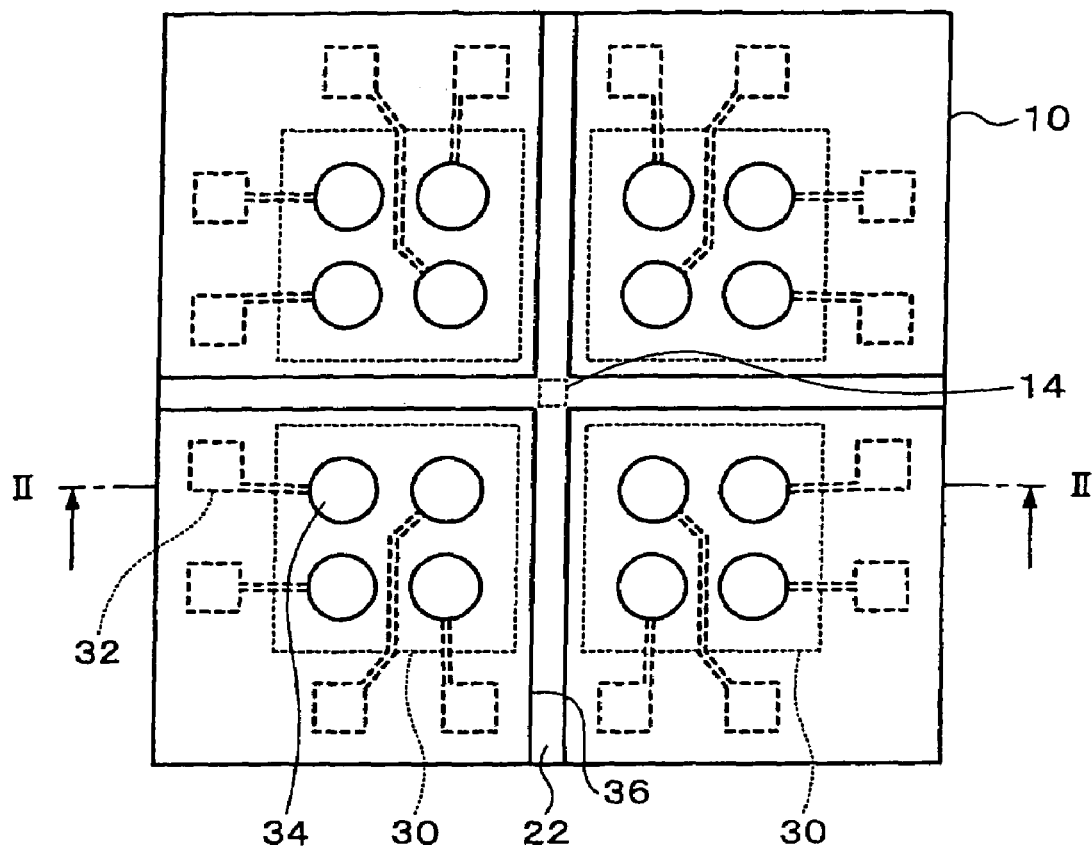
FIG. 1 is a plan view schematically showing a semiconductor device according to a first embodiment of the present invention.

An objective of embodiments of the present invention is to disperse stress of the resin layer.

(1) According to one embodiment of the present invention, there is provided a semiconductor device comprising:

a semiconductor substrate having an integrated circuit, an interconnect electrically connected to the inside of the semiconductor substrate, and an electrode formed on the interconnect;

a plurality of resin layers separately formed on the semiconductor substrate so that part of the semiconductor substrate is exposed;

a wiring pattern electrically connected to the electrode; and an external terminal formed on the wiring pattern and supported by the resin layers. According to this semiconductor device, since the resin layers are separately formed, internal stress is dispersed in comparison with the case where the resin layer is integrally formed. Since force applied to the semiconductor substrate is dispersed, warping of the semiconductor substrate can be reduced.

(2) In this semiconductor device, a penetrating hole may be formed in at least one of the resin layers.

(3) According to one embodiment of the present invention, there is provided a semiconductor device comprising:

a semiconductor substrate having an integrated circuit formed in the semiconductor substrate, an interconnect electrically connected to the inside of the semiconductor substrate, and an electrode formed on the interconnect;

a resin layer formed on the semiconductor substrate and having a penetrating hole so that part of the semiconductor substrate is exposed;

a wiring pattern electrically connected to the electrode; and an external terminal formed on the wiring pattern and supported by the resin layer. According to this semiconductor device, since the penetrating hole is formed in the resin layer, internal stress is dispersed in comparison with the case where the penetrating hole is not formed. Since force applied to the semiconductor substrate is dispersed, warping of the semiconductor substrate can be reduced.

(4) In this semiconductor device, the penetrating hole may be a slot.

(5) In this semiconductor device, the semiconductor substrate may be in the shape of a rectangle; and the slot may be formed along a diagonal of the rectangle.

(6) In this semiconductor device, an element may be formed in a portion of the semiconductor substrate exposed from the resin layers.

(7) In this semiconductor device, the wiring pattern may be formed to extend onto the resin layers.

(8) In this semiconductor device, the wiring pattern may be formed to pass under the resin layers; a conductive post may be formed on the wiring pattern to pass through the resin layers; and the external terminal may be formed on the conductive post.

(9) This semiconductor device may further comprise a second resin layer formed on the resin layers avoiding a space in the penetrating hole.

(10) According to one embodiment of the present invention, there is provided a semiconductor device comprising:

an interposer substrate on which a semiconductor chip is surface-mounted;

an interconnect layer formed on a back surface of the interposer substrate; protective layers separately disposed on the interconnect layer;

a solder ball connected to the interconnect layer through the protective layer; and a through-hole formed in the interposer substrate and connecting the semiconductor chip with the interconnect layer. According to this semiconductor device, the semiconductor chip can be sealed with a mold resin and the arrangement density of the solder balls can be increased. Moreover, the stress applied to the interconnect layer can be reduced. Therefore, reliability of secondary mounting can be improved and the mounting density can be increased.

(11) According to one embodiment of the present invention, there is provided a circuit board on which is mounted the above semiconductor device.

(12) According to one embodiment of the present invention, there is provided an electronic instrument comprising the above semiconductor device.

(13) According to one embodiment of the present invention, there is provided a method of manufacturing a semiconductor device comprising:

forming a plurality of resin layers separated from each other on a semiconductor substrate so that part of the semiconductor substrate is exposed, the semiconductor substrate having an integrated circuit, an interconnect electrically connected to the inside of the semiconductor substrate, and an electrode formed on the interconnect;

forming a wiring pattern electrically connected to the electrode; and forming an external terminal on the wiring pattern to be supported by the resin layers. According to this method of manufacturing a semiconductor device, since the resin layers are separately formed, internal stress is dispersed in comparison with the case where the resin layers are integrally formed. Since the force applied to the semiconductor substrate is dispersed, warping of the semiconductor substrate can be reduced.

(14) According to one embodiment of the present invention, there is provided a method of manufacturing a semiconductor device comprising:

forming a resin layer on a semiconductor substrate which has an integrated circuit, an interconnect electrically connected to the inside of the semiconductor substrate, and an electrode formed on the interconnect, the resin layer including a penetrating hole which exposes part of the semiconductor substrate;

forming a wiring pattern electrically connected to the electrode; and forming an external terminal on the wiring pattern to be supported by the resin layer. According to this method of manufacturing a semiconductor device, since the resin layer is formed to include the penetrating hole, internal stress is dispersed in comparison with the case where the penetrating hole is not formed. Since the force applied to the semiconductor substrate is dispersed, warping of the semiconductor substrate can be reduced.

(15) A method of manufacturing a semiconductor device according to yet another embodiment of the present invention comprises:

forming an interconnect layer on both surfaces of an interposer substrate, the interconnect layers being connected to each other by a through-hole;

forming a protective layer on one of the interconnect layers provided on a back surface of the interposer substrate;

dividing the protective layer by patterning to form an opening which exposes part of the one of the interconnect layers;

forming a solder ball connected to the one of the interconnect layers through the opening; and mounting a semiconductor chip on the interposer substrate. According to this method of manufacturing a semiconductor device, the semiconductor chip can be sealed with a mold resin and the arrangement density of the solder balls can be increased. Moreover, the stress applied to the interconnect layer can be reduced without increasing the number of manufacturing steps. This enables reliability of secondary mounting to be improved and the mounting density to be increased while preventing an increase in cost.

The embodiments of the present invention are described below with reference to the drawings.

First Embodiment

Figure 2:
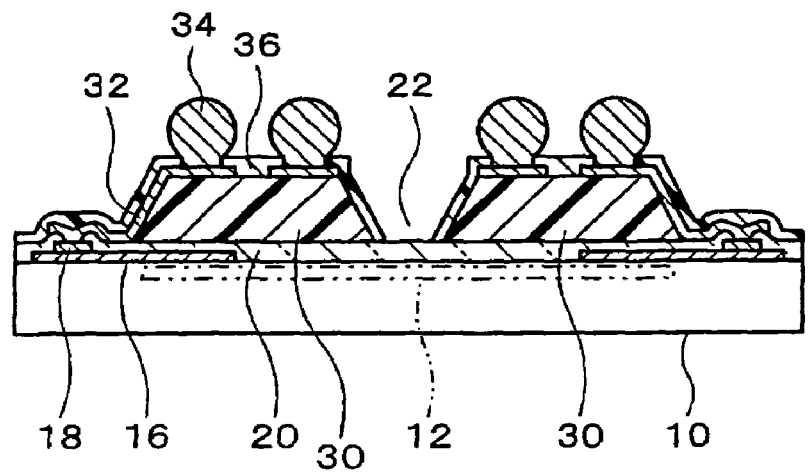
FIG. 2 is a cross-sectional view of the semiconductor device taken along the line the line II-II in FIG. 1

FIG. 1 is a plan view showing a semiconductor device according to a first embodiment of the present invention. FIG. 2 is a cross-sectional view of the semiconductor device taken along the line II-II in FIG. 1. The semiconductor device includes a semiconductor substrate 10. The semiconductor substrate 10 shown in FIG. 1 is a semiconductor chip. However, a semiconductor wafer may also be used. An integrated circuit 12 is formed in the semiconductor substrate 10. One integrated circuit 12 is formed in a semiconductor chip, and a plurality of integrated circuits 12 are formed in a semiconductor wafer. A region in which the integrated circuit 12 is formed may be referred to as an active region. The integrated circuit 12 may include an element 14 such as a fuse, transistor, or sensor (optical element (light receiving element or light emitting element), for example).

The semiconductor substrate 10 includes a plurality of interconnects (or interconnect layer) 16 electrically connected with the inside of the semiconductor substrate 10. The interconnects 16 include an interconnect electrically connected with the integrated circuit 12 (or active region). The interconnects 16 may include an interconnect connected with the inside of the semiconductor substrate 10 without being electrically connected with the integrated circuit 12. An electrode (pad) 18 is formed on the interconnect 16.

The semiconductor substrate 10 may include a passivation film 20. The passivation film 20 may be a resin film, a silicon oxide film, or a silicon nitride film. The passivation film 20 may be transparent such as a silicon oxide film, or may be opaque. The passivation film 20 may be formed to avoid a part (center, for example) of the electrode 18. The passivation film 20 covers the interconnects 16. The passivation film 20 may cover the entire integrated circuit 12 (or active region). If the passivation film 20 is transparent, the passivation film 20 may cover the element 14 even if the element 14 is an optical element (see FIG. 3A).

A plurality of resin layers 30 are separately formed on the semiconductor substrate 10. The resin layer 30 is formed so that a part of the semiconductor substrate 10 (part of the passivation film 20, for example) is exposed. The resin layer 30 is an electrical insulating layer. The resin layer 30 does not contain conductive particles. The resin layer 30 may have a stress relief function. The resin layer 30 may be formed of a polyimide resin, silicone-modified polyimide resin, epoxy resin, silicone-modified epoxy resin, benzocyclobutene (BCB), polybenzoxazole (PBO), or the like. The resin layer 30 is formed of a material having a light shielding property. The resin layer 30 is formed to avoid the top of the electrode 18. At least a part of the resin layer 30 may be formed on the integrated circuit 12 (or active region). The resin layer 30 may be formed to avoid the top of the element 14. In the case where the element 14 is located in an area 22 exposed from the resin layer 30, even if the resin layer 30 is opaque, light enters the element 14 if the passivation film 20 is transparent. If the resin layer 30 is formed to avoid the top of the element 14, the element 14 is not influenced by internal stress of the resin layer 30.

The semiconductor device includes a wiring pattern 32 electrically connected with the electrode 18. The wiring pattern 32 is formed so that a part of the wiring pattern 32 overlaps the electrode 18. The wiring pattern 32 is formed to extend onto the resin layer 30 (upper surface of the resin layer 30, for example). The wiring pattern 32 may pass on the passivation film 20. The wiring pattern 32 may be formed of a three-layer structure consisting of a TiW sputter interconnect layer, a Cu sputter interconnect layer, and a Cu plating interconnect layer, for example.

An external terminal (solder ball, for example) 34 is formed on the wiring pattern 32. The external terminal 34 may be formed of soft solder or hard solder. As the soft solder, solder containing no lead (hereinafter called lead-free solder) may be used. As the lead-free solder, a tin-silver (Sn—Ag) alloy, tin-bismuth (Sn—Bi) alloy, tin-zinc (Sn—Zn) alloy, or tin-copper (Sn—Cu) alloy may be used. At least one of silver, bismuth, zinc, and copper may be added to these alloys. The external terminal 34 is formed on the resin layer 30 and is supported by the resin layer 30. Therefore, a part of the external force applied to the external terminal 34 is absorbed by the resin layer 30.

The semiconductor device may include a plurality of second resin layers (protective layers such as a solder resist) 36. The second resin layer 36 is formed on the resin layer 30. The second resin layers 36 are separately disposed corresponding to the resin layers (stress relief layers) 30. The second resin layers 36 are formed to avoid the region between the adjacent resin layers (first resin layers) 30. The second resin layer 36 may be formed to avoid the entire area 22 of the semiconductor substrate 10 exposed from the resin layer 30, or may cover the edge of the area 22. The second resin layer 36 is formed to avoid the top of the element 14.

The second resin layer 36 is formed to cover the wiring pattern 32 while avoiding an area of the wiring pattern 32 in which the external terminal 34 is formed (land, for example). An opening which exposes the wiring pattern 32 is formed in the second resin layer 36 on the resin layer 30. The external terminal 34 is connected with the wiring pattern 32 through the opening formed in the second resin layer 36. The second resin layer 36 is in contact with at least the base of the external terminal 34. The second resin layer 36 may cover the electrode 18.

According to this embodiment, since the resin layers 30 are separately formed, internal stress is dispersed in comparison with the case where the resin layer 30 is integrally formed. Therefore, since force applied to the semiconductor substrate 10 is dispersed, warping of the semiconductor substrate 10 can be reduced.

According to this embodiment, the amount of expansion and contraction of the resin layer 30 formed on the interconnects 16 can be reduced, and the amount of expansion and contraction of the second resin layer 36 formed on the redistribution interconnects 32 can be reduced. Therefore, external force applied to the interconnects 16 and the redistribution interconnects 32 can be reduced, whereby the external terminals 34 can be formed on the semiconductor substrate 10 while reducing strain which occurs in the interconnects 16 and the redistribution interconnects 32. This enables reliability of secondary mounting to be improved and the mounting density to be increased.

Figure 3A:
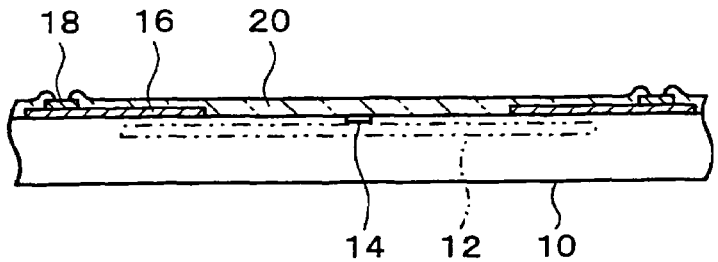
FIGS. 3A to 3E are cross-sectional views for illustrating a method of manufacturing a semiconductor device according to the first embodiment of the present invention.

FIGS. 3A to 3E are cross-sectional views for illustrating a method of manufacturing a semiconductor device according to this embodiment. In the following description of the manufacturing method, a semiconductor wafer is used as the semiconductor substrate 10. As shown in FIG. 3A, the element 14 is formed on the semiconductor substrate 10. The integrated circuit 12 is formed in the semiconductor substrate 10. The semiconductor substrate 10 includes the interconnect 16 which is electrically connected with the inside of the semiconductor substrate 10. The electrode 18 is formed on the interconnect 16.

Figure 3B:
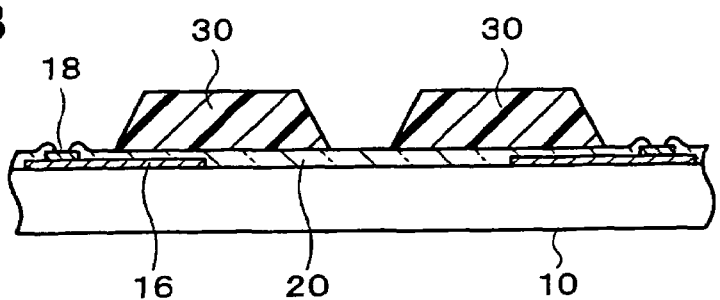

As shown in FIG. 3B, the resin layers 30 are separately formed on the semiconductor substrate 10 (passivation film 20, for example) so that a part of the semiconductor substrate 10 (part of the surface of the passivation film 20, for example) is exposed.

The formation process of the resin layer 30 may include applying a resin precursor (thermosetting resin precursor, for example) to the semiconductor substrate 10, or forming a resin precursor layer by spreading a resin precursor on the semiconductor substrate 10 by spin coating. A continuous or integral resin precursor layer may be formed by using a radiation sensitive resin precursor having a property sensitive to radiation (light (ultraviolet light or visible light), X-rays, or electron beams), and the resin precursor layer may be patterned into a plurality of the resin layers 30. The resin precursor layer is patterned by applying lithography. The resin layers 30 may be formed by printing (screen printing, for example). Each of the resin layers 30 may be formed of either a plurality of layers or a single layer. The resin layer 30 is formed to avoid the top of the electrode 18. The resin layer 30 is formed to avoid the top of the element 14. The resin layer 30 may be formed to avoid a cutting region of the semiconductor substrate 10.

Figure 3C:
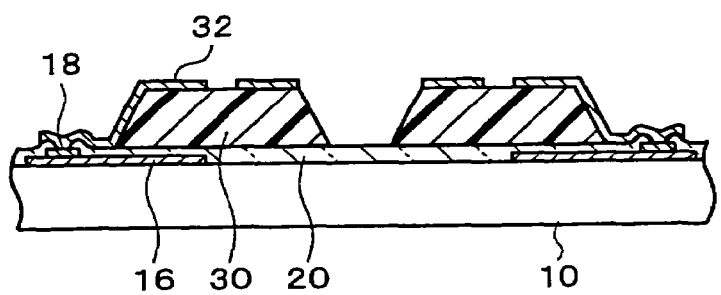

As shown in FIG. 3C, the wiring pattern 32 is formed so as to be electrically connected with the electrode 18. The wiring pattern 32 is formed to extend onto the resin layer 30. The wiring pattern 32 is formed to pass on the electrode 18. The wiring pattern 32 may pass on the side surface of the resin layer 30. The wiring pattern 32 may be formed to have a land (area wider than the line). The external terminal 34 is formed on the land. The wiring pattern 32 may be formed of either a single layer or a plurality of layers. For example, a TiW sputter film and a Cu sputter film are stacked by sputtering, and a plating resist film is then formed. An opening corresponding to the wiring pattern 32 is formed in the plating resist film by using photolithographic technology, and a Cu plating interconnect layer is formed by copper electroplating through the opening. The plating resist film is then removed, and a Cu sputter interconnect layer and a TiW sputter interconnect layer are formed by etching the Cu sputter film and the TiW sputter film by using the Cu plating interconnect layer as a mask to form the wiring pattern 32.

Figure 3D:
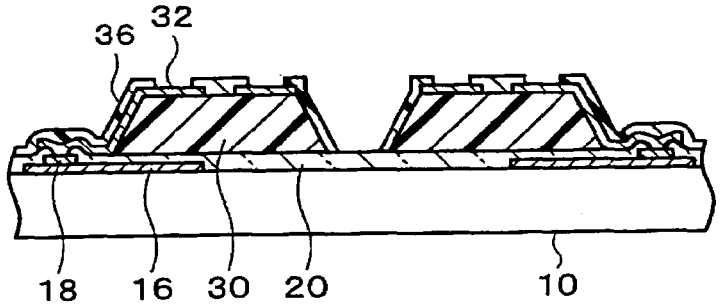

As shown in FIG. 3D, the second resin layer 36 may be formed on the resin layer 30. The description of the resin layer 30 may be applied to the second resin layer 36. The second resin layer 36 may be a solder resist. The second resin layer 36 is formed to cover the wiring pattern 32 excluding a part (center of the land, for example) of the wiring pattern 32. The second resin layer 36 is formed to avoid the region between the adjacent resin layers 30. The second resin layer 36 may be formed so that the cutting region of the semiconductor substrate 10 is exposed.

Figure 3E:
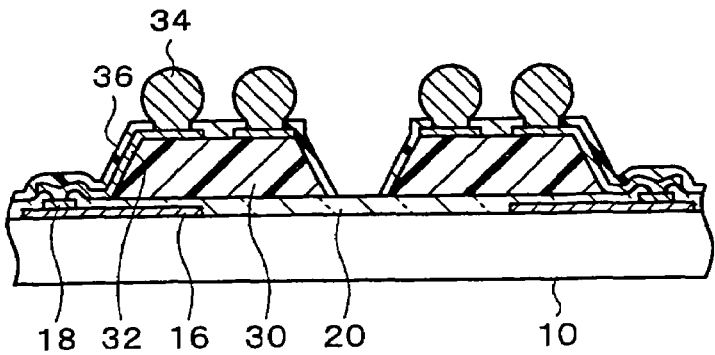

As shown in FIG. 3E, the external terminal 34 is formed on the wiring pattern 32 so that the external terminal 34 is supported by the resin layer 30. The external terminal 34 may be formed by applying a conventional method.

A third resin layer (not shown) may optionally be formed on the second resin layer 36. The description of the resin layer 30 may be applied to the third resin layer. The third resin layer is formed to cover an area other than the top of the external terminal 34. This enables stress which occurs due to external force applied to the external terminal 34 to be dispersed. This also enables bonding between the external terminal 34 and the wiring pattern 32 to be reinforced. The third resin layer may be formed to cover the entire semiconductor substrate 10 and then patterned. The third resin layer may be formed to cover the external terminal 34 and removed from the top of the external terminal 34. The third resin layer may be patterned by applying lithography. A part of the third resin layer may be removed by using a laser or ashing.

Figure 4:
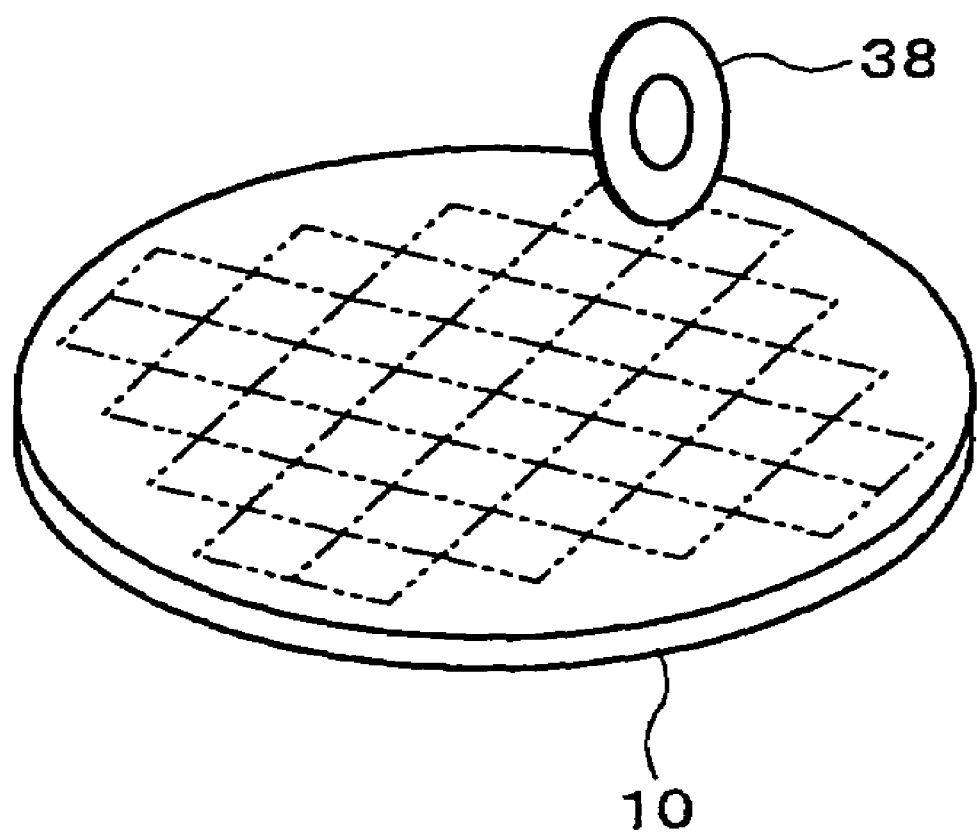
FIG. 4 is a view for illustrating the method of manufacturing a semiconductor device according to the first embodiment of the present invention.

As shown in FIG. 4, the semiconductor substrate 10 may be cut (diced or scribed). If the resin layer 30 and the second resin layer 36 are not formed in the cutting region of the semiconductor substrate 10, clogging of a cutter (or blade) 38 can be prevented since the resin is not cut. The semiconductor device is thus obtained.

Second Embodiment

Figure 5:
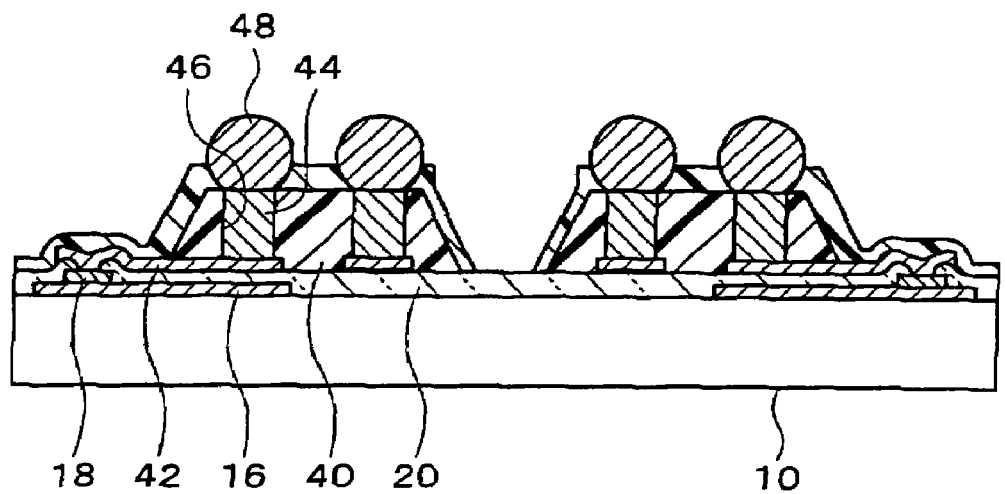
FIG. 5 is a cross-sectional view for illustrating a semiconductor device according to a second embodiment of the present invention.

FIG. 5 is a cross-sectional view for illustrating a semiconductor device according to a second embodiment of the present invention. In this embodiment, a wiring pattern 42 is formed to pass under a resin layer 40. The wiring pattern 42 is formed on the passivation film 20. A conductive post 44 is formed on the wiring pattern 42. The conductive post 44 is formed through the resin layer 40. Specifically, a penetrating hole 46 is formed in the resin layer 40. An external terminal 48 is formed on the conductive post 44. The description in the first embodiment is applied to other configurations and the manufacturing method.

According to this embodiment, since the penetrating hole 46 is formed in the resin layer 40, an effect equal to that in the case where the resin layer 40 is further divided can be obtained, whereby warping of the semiconductor substrate 10 can be further reduced.

Third Embodiment

Figure 6:
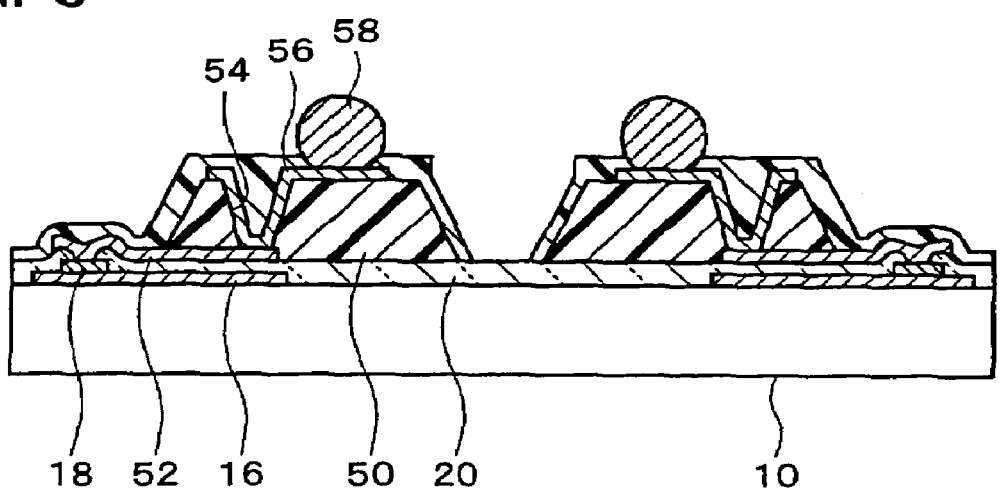
FIG. 6 is a cross-sectional view for illustrating a semiconductor device according to a third embodiment of the present invention.

FIG. 6 is a cross-sectional view for illustrating a semiconductor device according to a third embodiment of the present invention. In this embodiment, a wiring pattern 52 is formed to pass under a resin layer 50. The wiring pattern 52 is formed on the passivation film 20. A penetrating hole 54 is formed in the resin layer 50. The penetrating hole 54 is formed to overlap a part of the wiring pattern 52. Specifically, the resin layer 50 is formed so that a part of the wiring pattern 52 is exposed through the penetrating hole 54. An interconnect 56 is formed to extend from the wiring pattern 52 in the area exposed from the resin layer 50 to the resin layer 50 through the inner surface of the penetrating hole 54. An external terminal 58 is formed on the interconnect 56. The description in the first embodiment is applied to other configurations and the manufacturing method.

According to this embodiment, since an effect equal to that in the case where the resin layer 50 is further divided can be obtained by forming the penetrating hole 54 in the resin layer 50, warping of the semiconductor substrate 10 can be further reduced.

Fourth Embodiment

Figure 7:
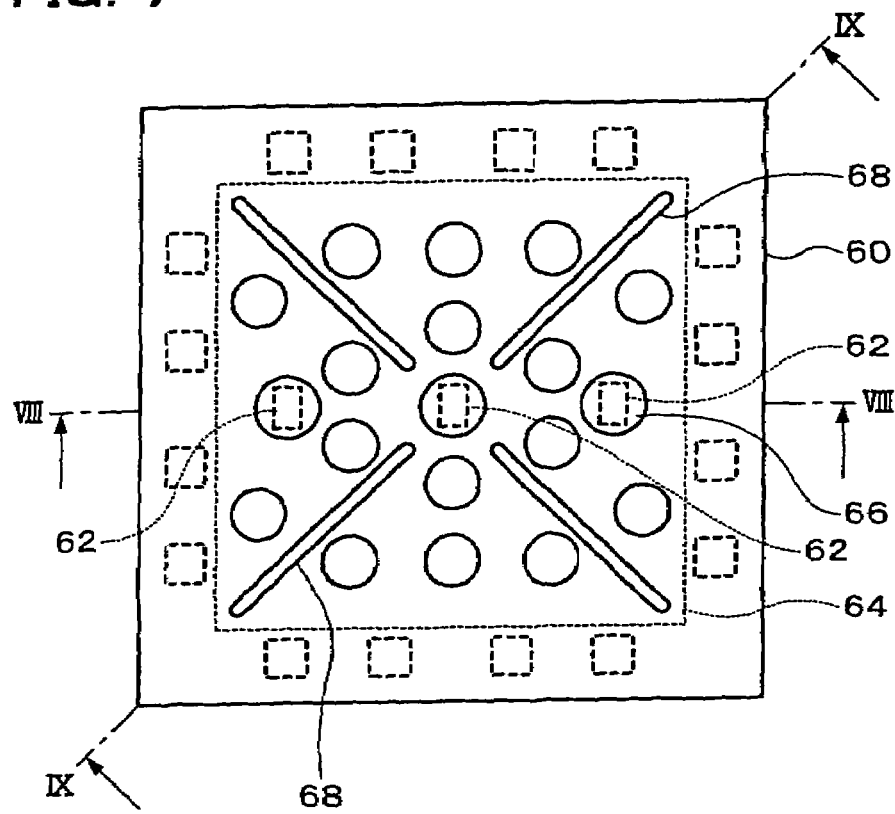
FIG. 7 is a plan view schematically showing a semiconductor device according to a fourth embodiment of the present invention.
Figure 8:
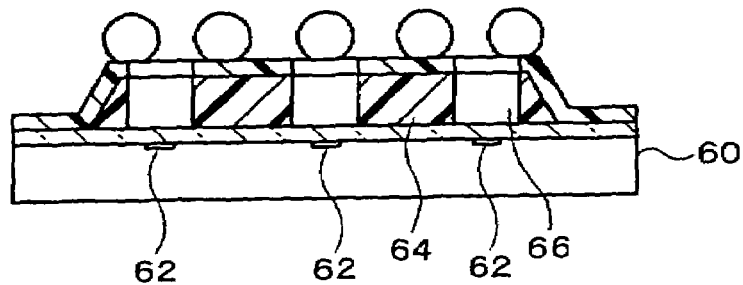
FIG. 8 is a cross-sectional view of the semiconductor device taken along the line VIII-VIII in FIG. 7.
Figure 9:
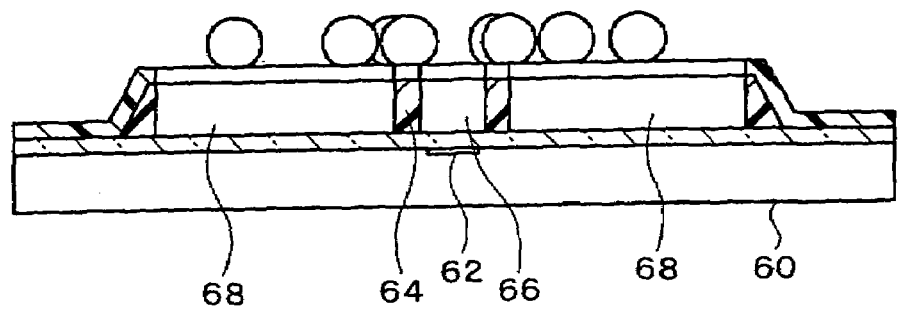
FIG. 9 is a cross-sectional view of the semiconductor device taken along the line IX-IX in FIG. 7.

FIG. 7 is a plan view showing a semiconductor device according to a fourth embodiment of the present invention. FIG. 8 is a cross-sectional view of the semiconductor device taken along the line VIII-VIII in FIG. 7. FIG. 9 is a cross-sectional view of the semiconductor device taken along the line IX-IX in FIG. 7. The semiconductor device includes a semiconductor substrate 60. The semiconductor substrate 60 includes one or more elements 62. The element 62 is a fuse, transistor, sensor (optical element (light receiving element or light emitting element), for example), or the like. The element 62 may be an element which is easily influenced by external force, or an element which emits or receives light. The description of the semiconductor substrate 10 in the first embodiment is applied to the semiconductor substrate 60.

A resin layer 64 is formed on the semiconductor substrate 60. One or more penetrating holes 66 and 68 are formed in the resin layer 64. The penetrating hole 66 is formed so that the element 62 is disposed inside the penetrating hole 66. This prevents the element 62 from being covered with the resin layer 64, whereby the element 62 is not influenced by internal stress of the resin layer 64. Moreover, emission or reception of light by the element 62 is not prevented. The penetrating hole 66 may be formed at the center of the resin layer 64.

The penetrating hole 68 is a slot. The semiconductor substrate 60 is in the shape of a rectangle, and the penetrating hole (slot) 68 is formed along the diagonal of the rectangle. The penetrating hole 68 is formed so as not to cut the resin layer 64. The penetrating hole (slot) 68 is formed to avoid the edge of the resin layer 64. The penetrating hole 68 may be formed to avoid the center of the resin layer 64.

A method of manufacturing the semiconductor device includes forming the resin layer 64 having the penetrating holes 66 and 68 which expose a part of the semiconductor substrate 60 on the semiconductor substrate 60. The description in the first embodiment is applied to other configurations and the manufacturing method. According to this embodiment, since an effect equal to that in the case where the resin layer 64 is divided can be obtained by forming the penetrating holes 66 and 68 in the resin layer 64, warping of the semiconductor substrate 60 can be further reduced.

Fifth Embodiment

Figure 10:
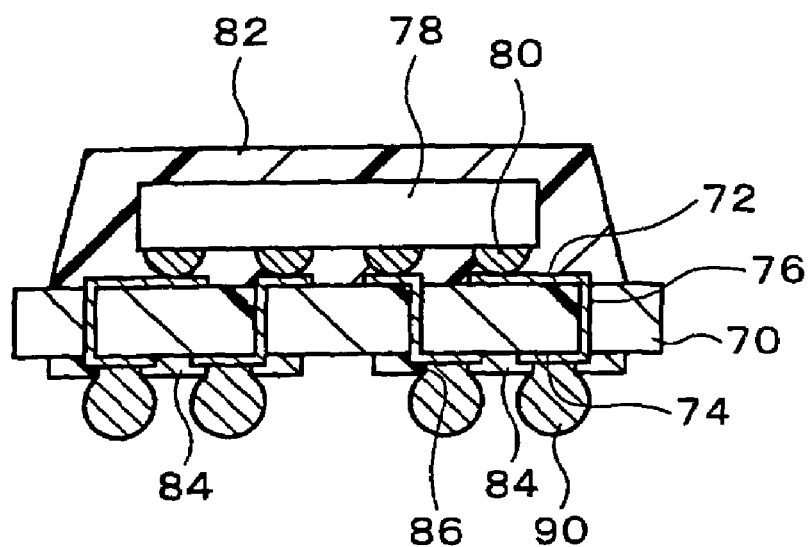
FIG. 10 is a cross-sectional view of a semiconductor device according to a fifth embodiment of the present invention.
Figure 11:
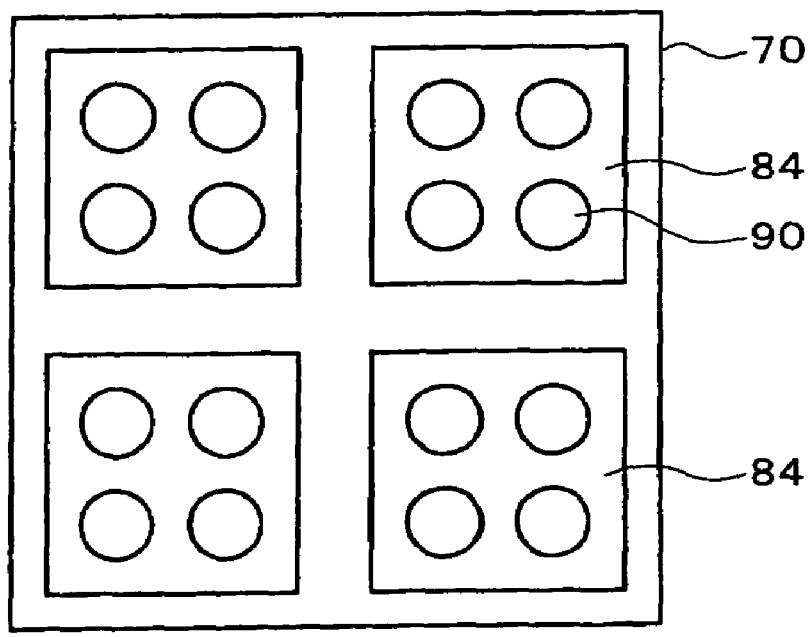
FIG. 11 is a bottom view of the semiconductor device shown in FIG. 10.

FIG. 10 is a cross-sectional view showing a semiconductor device according to a fifth embodiment of the present invention. FIG. 11 is a bottom view of the semiconductor device shown in FIG. 10. In FIG. 10, interconnect layers 72 and 74 are formed on each surface of an interposer substrate 70. The interconnect layers 72 and 74 are connected through a through-hole 76. A semiconductor chip (IC chip, for example) 78 is mounted (surface-mounted, for example) on the surface of the interposer substrate 70. The semiconductor chip 78 is connected with the interconnect layer 72 through a bump 80 and is sealed with a mold resin 82. A protective layer (solder resist film, for example) 84 which protects the interconnect layer 74 is formed on the interconnect layer 74 on the back surface of the interposer substrate 70. The protective layers 84 are separately disposed. An opening 86 which exposes the interconnect layer 74 is formed in the protective layer 84. A solder ball 90 is disposed on the interconnect layer 74 through the opening 86. The solder ball 90 is connected with the interconnect layer 74 through the opening 86 formed in the protective layer 84. This enables the amount of expansion and contraction of the protective layer 84 formed on the interconnect layer 74 to be reduced, whereby force applied to the interconnect layer 74 can be reduced. Therefore, strain which occurs in the interconnect layer 74 can be reduced in a semiconductor device having a ball grid array (BGA) structure, whereby reliability of secondary mounting can be improved and the mounting density can be increased.

In a method of manufacturing the semiconductor device according to this embodiment, the interconnect layers 72 and 74 connected through the through-hole 76 are formed on each surface of the interposer substrate 70. The protective layer 84 is formed on the interconnect layer 74 formed on the back surface of the interposer substrate 70. The protective layer 84 is divided and the opening 86 which exposes the interconnect layer 74 is formed by patterning the protective layer 84. The solder ball 90 is formed so as to be connected with the interconnect layer 74 through the opening 86. The semiconductor chip 78 is mounted on the surface of the interposer substrate 70.

Figure 12:
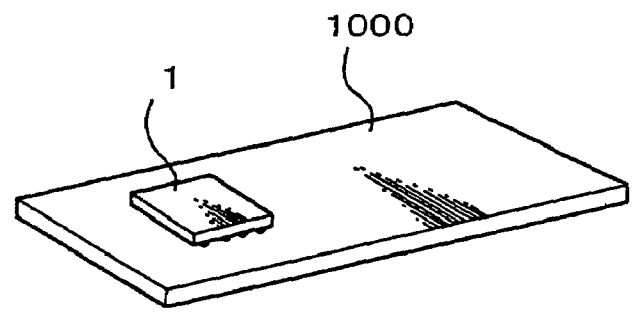
FIG. 12 shows a circuit board on which is mounted a semiconductor device according to one embodiment of the present invention.
Figure 13:
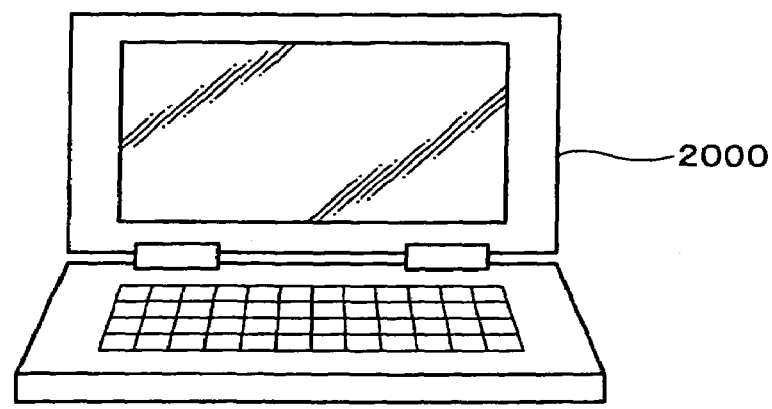
FIG. 13 shows an electronic instrument having a semiconductor device according to one embodiment of the present invention.
Figure 14:
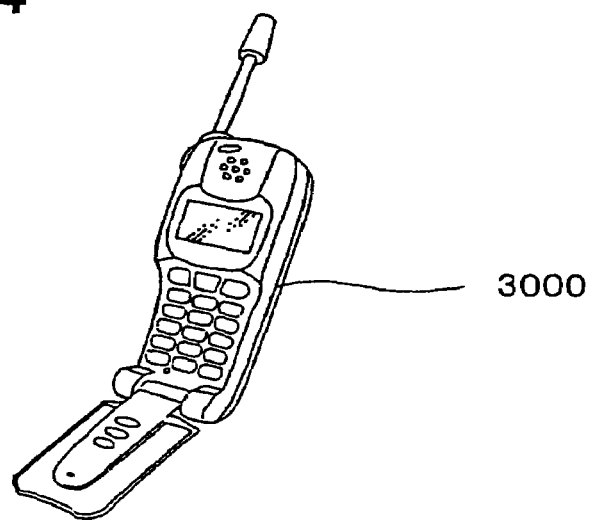
FIG. 14 shows another electronic instrument having a semiconductor device according to one embodiment of the present invention.
Figure 15:
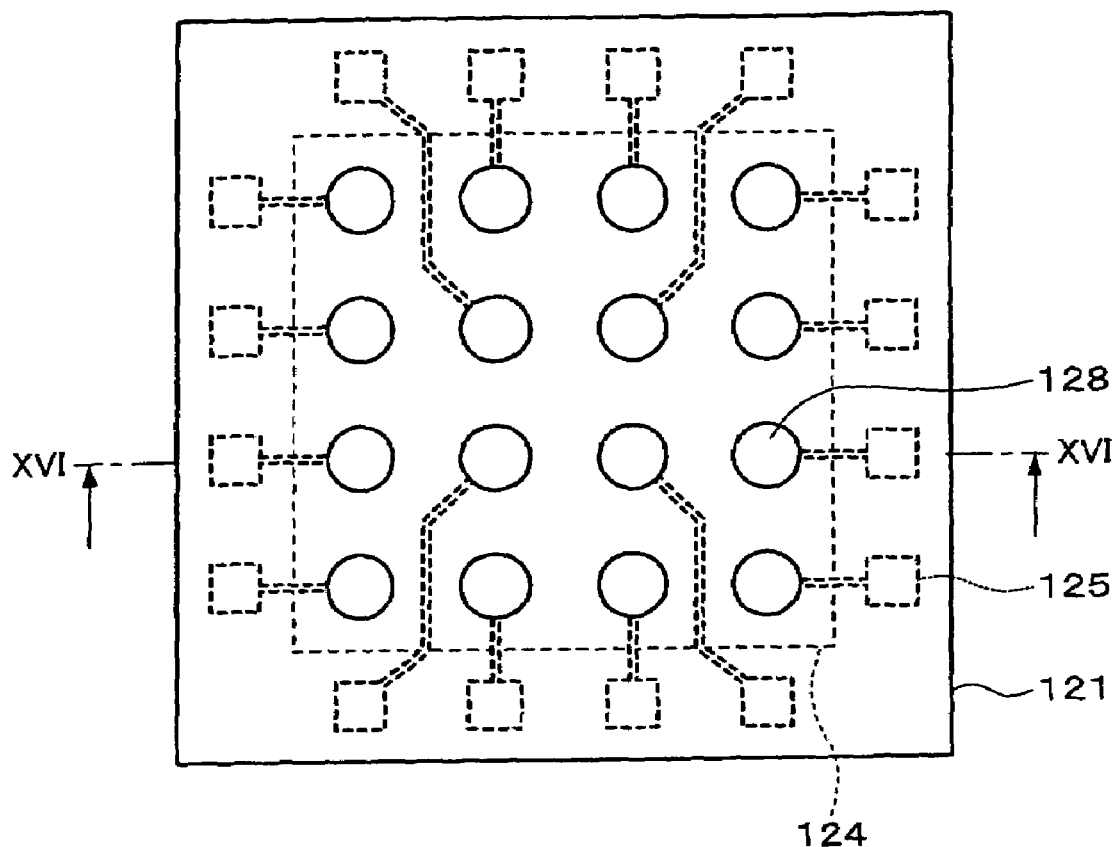
FIG. 15 is a plan view schematically showing the configuration of a conventional chip size package.
Figure 16:
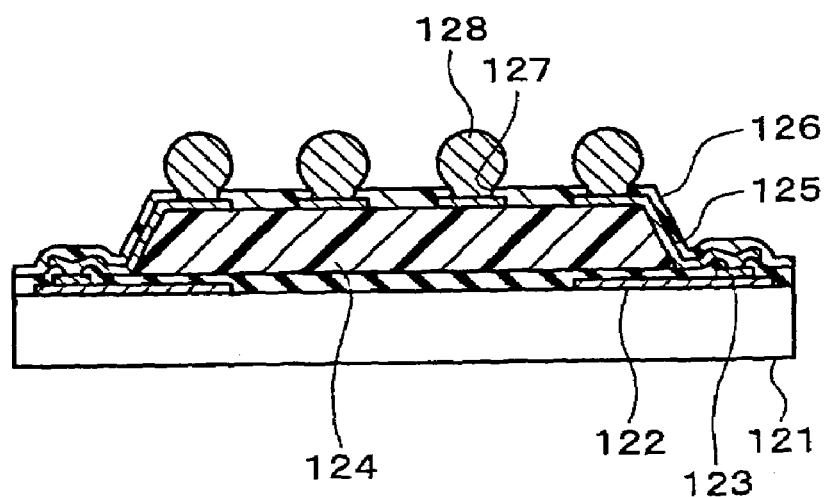
FIG. 16 is a cross-sectional view of the chip size package taken along the line XVI-XVI in FIG. 15.

FIG. 12 shows a circuit board 1000 on which the semiconductor device 1 described in the above embodiment is mounted. FIGS. 13 and 14 respectively show a notebook-type personal computer 2000 and a portable telephone 3000 as examples of electronic instruments including the semiconductor device.

The present invention is not limited to the above-described embodiments. Various modifications and variations are possible. For example, the present invention includes configurations essentially the same as the configurations described in the embodiments (for example, configurations having the same function, method, and results, or configurations having the same object and results). The present invention includes configurations in which any unessential part of the configuration described in the embodiments is replaced. The present invention includes configurations having the same effects or achieving the same object as the configurations described in the embodiments. The present invention includes configurations in which conventional technology is added to the configurations described in the embodiments.

What is claimed is:

1. A semiconductor device comprising:
   a semiconductor substrate that has a shape of a rectangle and includes an integrated circuit, an interconnect and an electrode, the integrated circuit being formed in the semiconductor, substrate and including an element, the interconnect being electrically connected to the integrated circuit, the electrode being electrically connected to the interconnect;
   a resin layer that is formed on the semiconductor substrate and includes a penetrating hole and a slot, the penetrating hole being formed above the element, the slot extending along a diagonal of the rectangle;
   a wiring pattern that is electrically connected to the electrode; and
   an external terminal that is formed on the wiring pattern and above the resin layer.

2. The semiconductor device as defined in claim 1, wherein the element is formed inside the penetrating hole when a plan view is taken parallel to a top surface of the resin layer.

3. The semiconductor device as defined in claim 1, wherein the wiring pattern extends onto the resin layer.

4. The semiconductor device as defined in claim 1, wherein:
   the wiring pattern passes under the resin layer;
   a conductive post is formed on the wiring pattern to pass through the resin layer; and
   the external terminal is formed on the conductive post.

5. The semiconductor device as defined in claim 1, further comprising:
   a second resin layer formed on the resin layer avoiding a region between the adjacent resin layers.

6. A circuit board on which is mounted the semiconductor device as defined in claim 1.

7. An electronic instrument comprising the semiconductor device as defined in claim 1.

8. The semiconductor device as defined in claim 1, wherein
   the resin layer has an edge and the penetrating hole is disposed a distance from the edge of the resin layer.

9. The semiconductor device as defined in claim 1, wherein
   the element is a sensor element or an optical element.

10. A method of manufacturing a semiconductor device comprising:
    forming a resin layer on a semiconductor substrate that has the shape of a rectangle and includes an integrated circuit, an interconnect and an electrode, the integrated circuit being formed in the semiconductor substrate, the interconnect being electrically connected to the integrated circuit, the electrode being electrically connected to the interconnect, the integrated circuit including an element, the resin layer including a penetrating hole and a slot, the penetrating hole being formed above the element, the slot extending along a diagonal of the rectangle;
    forming a wiring pattern electrically connected to the electrode; and
    forming an external terminal on the wiring pattern to be supported by the resin layer.

* * * * *